US012694499B2

(12) United States Patent    (10) Patent No.:   US 12,694,499 B2

Levins et al.         (45) Date of Patent:     Jul. 28, 2026

(54) IMAGING DEVICE AND SYSTEM FOR INSPECTING CABLES AND CABLE JOINTS

(71) Applicant: SUBCOM, LLC, Eatontown, NJ (US)

(72) Inventors: Andrew David Levins, Romsey (GB); Joseph Man, London (GB); Michael Whitfield, Romsey (GB); James Fotheringham Jackson, Baltimore, MD (US)

(73) Assignee: SubCom, LLC, Eatontown, NJ (US)

( * ) Notice: Subject to any disclaimer, the term of this patent is extended or adjusted under 35 U.S.C. 154(b) by 514 days.

(21) Appl. No.: 17/727,082

(22) Filed: Apr. 22, 2022

(65) Prior Publication Data

US 2022/0414860 A1     Dec. 29, 2022

Related U.S. Application Data

(60) Provisional application No. 63/214,945, filed on Jun. 25, 2021.

(51) Int. Cl.
    *G06T 7/00*       (2017.01)
    *G01R 31/08*      (2020.01)
           (Continued)

(52) U.S. Cl.
    CPC .......... *G06T 7/0004* (2013.01); *G01R 31/083* (2013.01); *G06T 7/60* (2013.01);
           (Continued)

(58) Field of Classification Search
    CPC .................... G06T 7/0004; G06T 7/60; G06T 2207/10116; G06T 2207/30148;
           (Continued)

(56) References Cited

U.S. PATENT DOCUMENTS 6,485,176 B1 *   11/2002   Chen ...................... G01N 23/04
                                      378/197
11,585,765 B1 *   2/2023   Kim ...................... G06T 7/0004
              (Continued)

FOREIGN PATENT DOCUMENTS

CN       107976456 A     5/2018
JP        H03297014 A    12/1991
              (Continued)

OTHER PUBLICATIONS

Robinson, Adrian P, Automated high voltage cable joint inspection using X-ray techniques. University of Southampton, Doctoral Thesis. pp. 15, 58-59, 62, 84, 97, 107, 122, 154, 158-159, 167, 169, 188, 191-191, 216 (Year: 2006).*

(Continued)

*Primary Examiner* — Stephen R Koziol
(74) *Attorney, Agent, or Firm* — KDW Firm PLLC

(57) ABSTRACT

Provided is a cable and joint inspection system, process and computer readable medium enabling cable and joint inspection functions. The system includes an x-ray cabinet containing an x-ray camera and positioning equipment. The x-ray camera is positionable to obtain an x-ray image of a portion of a cable or a cable joint. The x-ray images are evaluated to determine whether a bounded area is within the x-ray image. The processor may measure the size of the bounded area in the x-ray image based on a number of pixels forming the bounded area. In response to the size of the bounded area being greater than an inclusion or void allowance threshold, the processor may flag the bounded area as an inclusion or void and flag pixel locations in the x-ray image. The flagged pixel locations correspond to a physical location within the portions of the cable or the cable joint.

10 Claims, 13 Drawing Sheets

(51) Int. Cl.
   *G01R 31/12*           (2020.01)
   *G06T 7/60*            (2017.01)
   *H04N 23/54*         (2023.01)
   *H04N 23/695*      (2023.01)

(52) U.S. Cl.
   CPC ........... *H04N 23/54* (2023.01); *H04N 23/695*
       (2023.01); *G01R 31/1218* (2013.01); *G06T*
       *2207/10116* (2013.01); *G06T 2207/30148*
                     (2013.01)

(58) Field of Classification Search
   CPC ............ G06T 2207/30108; G06T 7/62; G01R
       31/083; G01R 31/1218; H04N 23/54;
           H04N 23/695; G01N 23/04
   See application file for complete search history.

(56) References Cited

U.S. PATENT DOCUMENTS

| | | | |
|---|---|---|---|
| 2008/0078940 A1* | 4/2008 | Castleberry | ......... G01T 1/20189 |
| | | | 250/370.09 |
| 2012/0294508 A1 | 11/2012 | Wada | |
| 2015/0124245 A1* | 5/2015 | Srocka | ............... G01N 21/9501 |
| | | | 356/73 |
| 2019/0219730 A1* | 7/2019 | Jegou | ........................ G01V 5/22 |
| 2021/0010953 A1* | 1/2021 | Adler | .................... G06F 18/214 |
| 2021/0148997 A1 | 5/2021 | Tao et al. | |
| 2021/0334587 A1* | 10/2021 | Wang | ...................... G06T 7/001 |

FOREIGN PATENT DOCUMENTS

| | | | | |
|---|---|---|---|---|
| JP | H1164249 A | | 3/1999 | |
| JP | 5949480 B2 | * | 7/2016 | |
| KR | 1374634 B1 | * | 3/2014 | ............ G01N 23/04 |
| WO | 2020189044 A1 | | 9/2020 | |

OTHER PUBLICATIONS

Global Marine, Digital X-Ray Camera DXr1 Data Sheet, Dec. 22, 2018, Global Marine. https://web.archive.org/web/20181222141204/http://www.globalmarine.co.uk/uploads/documents/tools-equipment/dxr1-data-sheet-m052-v1.pdf (Year: 2018).*
Global Marine Group, Global Marine mark delivery of 80th digital X-Ray camera, Aug. 3, 2023, Global Marine Group. https://globalmarine.group/global-marine-mark-delivery-of-80th-digital-x-ray-camera/ (Year: 2023).*
Universal Jointing Consortium, Bulletin No. UJCB082 Issue 1, Nov. 30, 2018, UJ Consortium. https://ujconsortium.com/images/bulletin/UJCB82_Issue_1_End_of_Support_for_CAM004AA_and_CAM005AA.pdf (Year: 2018).*
Partial European Search Report and Written Opinion for Application No. EP22180193, mailed Oct. 31, 2022, 12 pages.
Extended European Search Report and Written Opinion for the European Application No. EP22180193, mailed Jan. 27, 2023, 13 pages.
Peng, Sh., Nam, H.D. Void defect detection in ball grid array X-ray images using a new blob filter. J. Zhejiang Univ.—Sci. C 13, 840-849 (2012).

\* cited by examiner

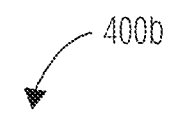
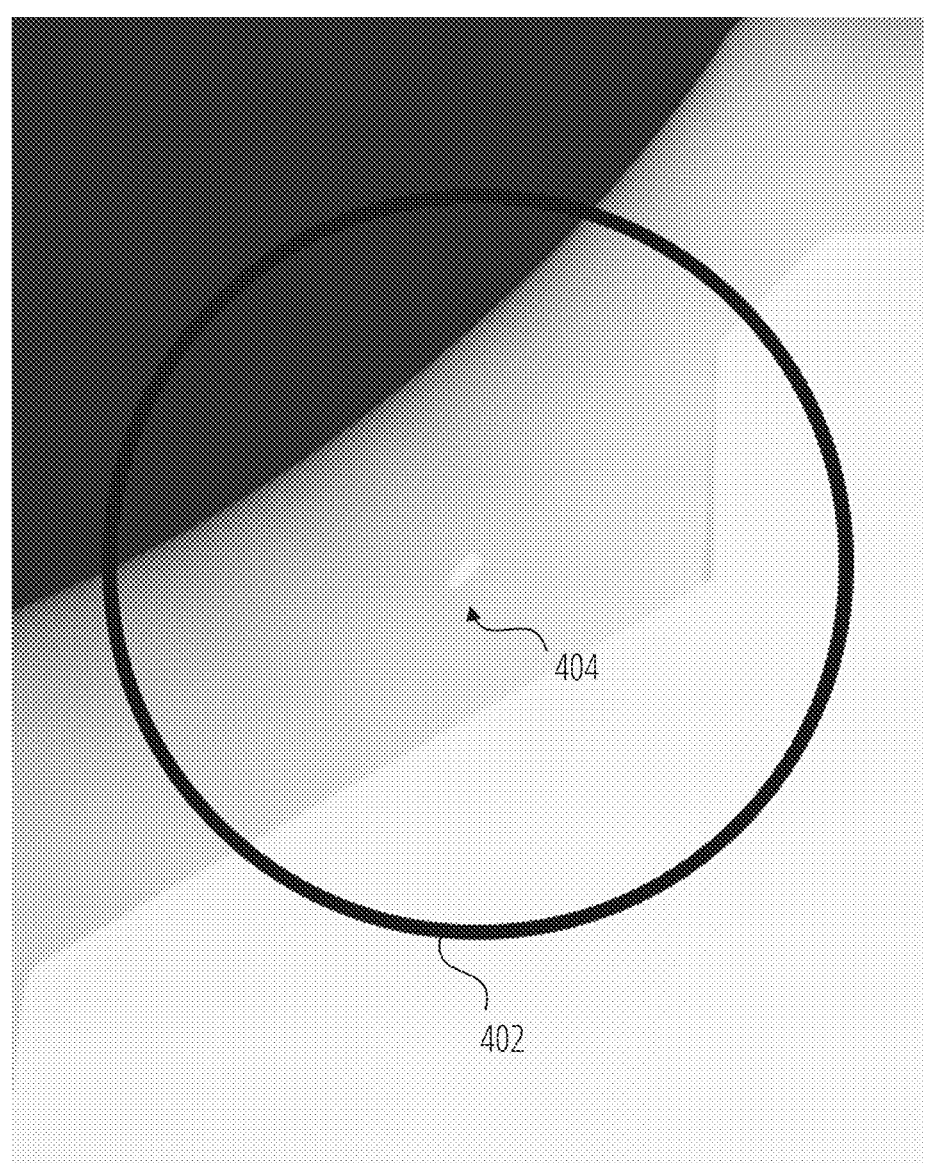
FIG. 4B

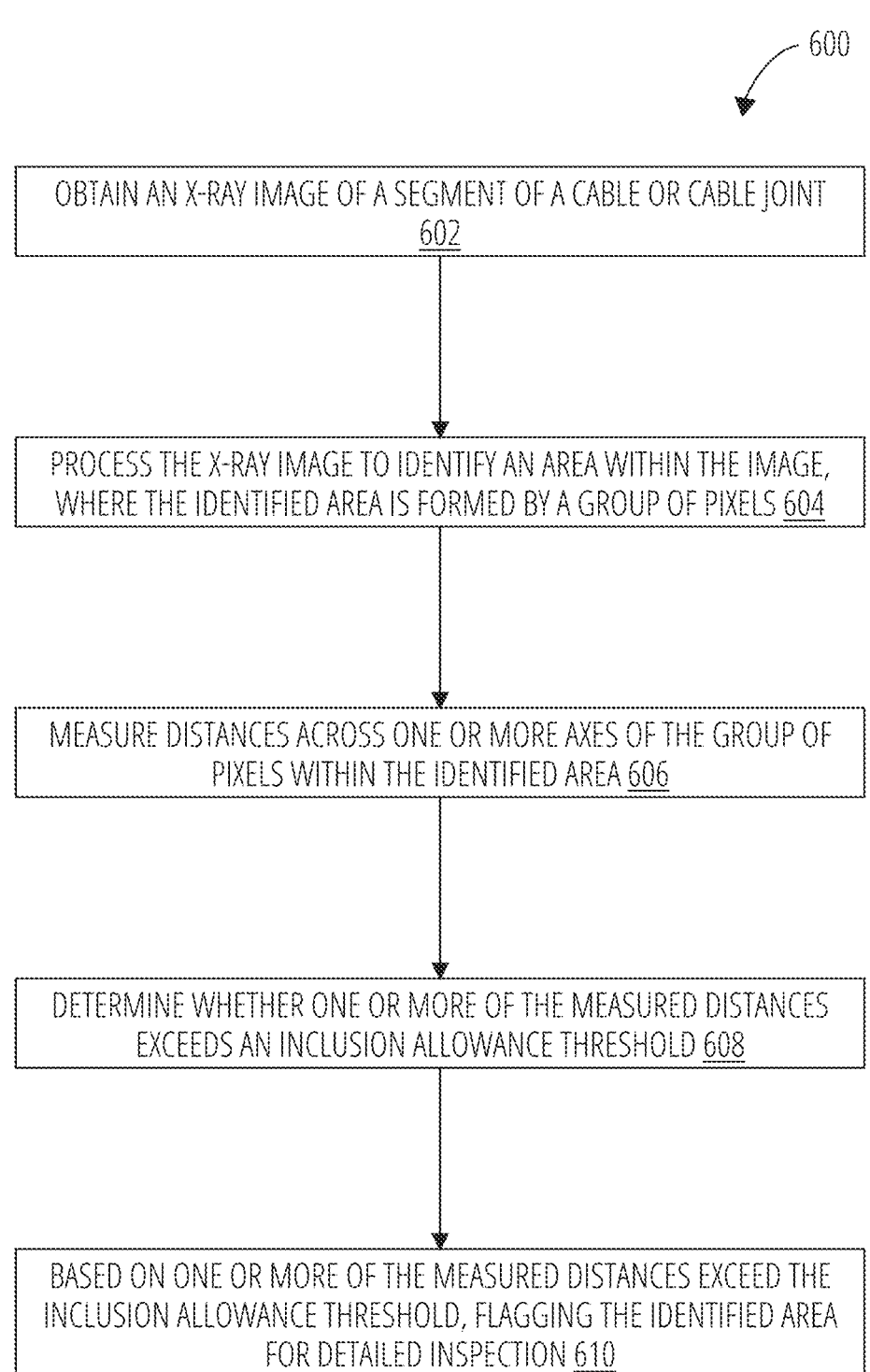

600

OBTAIN AN X-RAY IMAGE OF A SEGMENT OF A CABLE OR CABLE JOINT
602

PROCESS THE X-RAY IMAGE TO IDENTIFY AN AREA WITHIN THE IMAGE, WHERE THE IDENTIFIED AREA IS FORMED BY A GROUP OF PIXELS 604

MEASURE DISTANCES ACROSS ONE OR MORE AXES OF THE GROUP OF PIXELS WITHIN THE IDENTIFIED AREA 606

DETERMINE WHETHER ONE OR MORE OF THE MEASURED DISTANCES EXCEEDS AN INCLUSION ALLOWANCE THRESHOLD 608

BASED ON ONE OR MORE OF THE MEASURED DISTANCES EXCEED THE INCLUSION ALLOWANCE THRESHOLD, FLAGGING THE IDENTIFIED AREA FOR DETAILED INSPECTION 610

FIG. 6

OPENING FOR SEGMENT OF CABLE 726

700

702

706

IMAGING DEVICE AND SYSTEM FOR INSPECTING CABLES AND CABLE JOINTS

RELATED APPLICATION

This application claims priority to U.S. provisional patent application Ser. No. 63/214,945, filed on Jun. 25, 2021, entitled "Imaging Device and System for Inspecting Cables and Cable Joints," which is incorporated herein by reference in its entirety.

FIELD OF THE DISCLOSURE

The present embodiments relate to semiconductor device patterning, and more particularly, to devices and techniques for forming optimized gate-all-around transistors.

BACKGROUND

Optical fibers may be used as transmission paths for optical signals in communications networks. Such optical fibers often must extend across many miles and large bodies of water (and land at shore ends). To protect the optical fibers, particularly in an undersea or submarine environment, the optical fibers may be included in an optical cable that provides many layers of protection. An undersea or submarine optical cable may include, for example, layers of strength members, optical packaging/tubing, a conductor, insulation, shielding, and sheaths depending upon the system environmental conditions.

Optical cables are often coupled to undersea devices such as joints that provide coupling to other cables, repeaters that provide amplification of optical signals, and branching units that provide branching of optical signals. To repair an optical cable, for example, one segment of the optical cable may be coupled to another segment of an optical cable using a cable-to-cable joint such as one known as a Millennia® Joint (MJ) available from SubCom, LLC The conductor within an optical cable provides power to electronic equipment within certain types of undersea devices. When joining an optical cable including a conductor, an electrical connection may be made from the cable conductor to another cable conductor (e.g., within a joint) or a powered component (e.g., within a repeater or branching unit).

Since the joint of a repaired cable is enshrouded in a polymer overmolding, inspection of the integrity of the repaired joint requires the use of imaging devices, such as x-ray cameras. Presently, using a previously available x-ray camera is tedious work as these x-ray cameras required a trained operator to visually examine every image generated by the camera for very small defects and other non-conformities in certain areas deemed critical.

BRIEF SUMMARY

In one aspect, a cable inspection system is provided that includes an x-ray cabinet containing an x-ray camera including an x-ray source and a detector, and positioning equipment. The x-ray camera is mounted on a gimbal and the positioning equipment is coupled to the gimbal and operable to position the x-ray camera to obtain an x-ray image of a cable or a cable joint. The cable inspection system also includes a processor communicatively coupled to the x-ray camera and the positioning equipment, and a memory coupled to the processor. The memory is operable to store programming code enabling control of the x-ray camera and the positioning equipment. The processor when executing the programming code is operable to actuate the positioning equipment to position the x-ray camera to obtain an x-ray image of a number of selected portions of the cable or cable joint and obtain an x-ray image at each selected portion of the number of selected portions of the cable or cable joint. Each x-ray image may include a number of pixels having predetermined dimensions and each pixel of the number of pixels having a pixel intensity value and coordinates within the x-ray image. The processor may be operable to process the pixel intensity values of the number of pixels of the x-ray image to identify bounded area within the x-ray image. The processor may be operable to measure the size of the bounded area in the x-ray image based on a number of pixels forming the identified inclusion or void. In response to the size of the bounded area being greater than an inclusion or void allowance threshold, the processor may flag a pixel location within the x-ray image for a detailed inspection. The flagged pixel location corresponds to a physical location within the selected portions of the cable or the cable joint.

In another aspect, a method is provided that includes obtaining an x-ray image of a segment of a cable or cable joint. The x-ray image may be processed to identify an area within the image, where the identified area is formed by a group of pixels. Distances across one or more axes of the group of pixels within the identified area may be measured. A true distance may be obtained by multiplying the measured distance by a scaling factor. Whether one or more of the true distances exceeds an inclusion or void allowance threshold is determined and based on one or more of the true distances exceeding the inclusion or void allowance threshold, the identified area may be flagged for detailed inspection.

In a further aspect, a non-transitory computer-readable storage medium, including instructions that when executed by a processor, cause the processor to perform functions is provided. The functions include the processor obtaining a number of x-ray images of a segment of a cable or cable joint. Each x-ray image may be an image of the segment of the cable or cable joint at a respective longitudinal position and a respective angular position. The image is formed from a number of pixels having pixel intensity values. The processor may process each x-ray image of the number of x-ray images to identify a change in a gradient of pixel intensity values of pixels within the x-ray image of the respective longitudinal positions and the respective angular position. The processor may determine whether the identified change in the gradient of the pixel values of the pixels forms a bounded area. In response to a determination that a bounded area is formed, an updated longitudinal position and an updated angular position with respect to the bounded area is selected to obtain another x-ray image of the segment of the cable or cable joint. The other x-ray image of the segment of the cable or cable joint is obtained at the updated longitudinal position and updated angular position, and the processing and the determining are performed using the other x-ray image to locate the change in the gradient in the other x-ray image that corresponds to the bounded area.

BRIEF DESCRIPTION OF THE DRAWINGS

The drawings are provided to supplement the written description and are not intended to be limiting of the disclosed subject matter.

FIG. 4B illustrates a further increased resolution image of the x-ray image of FIG. 4A, which has been processed according to the example processes described herein.

FIG. 6 shows a flowchart of another example of a process for inspecting a segment of a cable or a cable joint in accordance with another embodiment.

DETAILED DESCRIPTION

The following discussion is related to x-ray camera inspection of cables and cable joints. The following x-ray camera and system are operable to provide full auto inspection and/or the use of the camera for specific angular and longitudinal and latitudinal positioning along a cable or cable joint. The longitudinal position refers to the length (i.e., a longer dimension) of the cable or cable joint as it passes from a first entry point into the x-ray cabinet, through the x-ray cabinet and out of the x-ray cabinet. Conversely, a latitudinal position of the cable may refer to points across a width (i.e., the shorter dimension) of the cable or cable joint. Imaging may take place in the longitudinal direction, the latitudinal direction, or both depending upon the object being imaged. For ease of discussion, imaging in the longitudinal direction is described in the following examples The advantages of the disclosed cable inspection system include real time or close to real time assessment of the obtained images, reduced assessment time of the obtained images, reduced marine repair time as well as eliminating the need to store any hazardous chemicals related to x-ray film development.

At a high level, the cable inspection system includes an x-ray cabinet containing an x-ray camera and positioning equipment. The x-ray camera is positionable to obtain an x-ray image of a portion of a cable or a cable joint. The cable inspection system is used to locate inclusions or voids within the portion of the cable or joint. A void may be any form of abnormality, such as bubbles of gas/air that might be entrapped in the dielectric of the cable or cable joint, or damage to the conductor, joint, void, lift off or the like. A processor evaluates the x-ray images to determine whether a bounded area is present within the x-ray image. The processor may be operable to measure the size of the bounded area in the x-ray image based on a number of pixels forming the bounded area. In response to the size of the bounded area being greater than an inclusion or void allowance threshold, the processor may flag the bounded area as an inclusion or void and flag pixel locations in the x-ray image. The flagged pixel locations correspond to a physical location within the portions of the cable or the cable joint. The following discussion provides details of the processes and techniques utilized by the disclosed cable inspection system.

Figure 1:
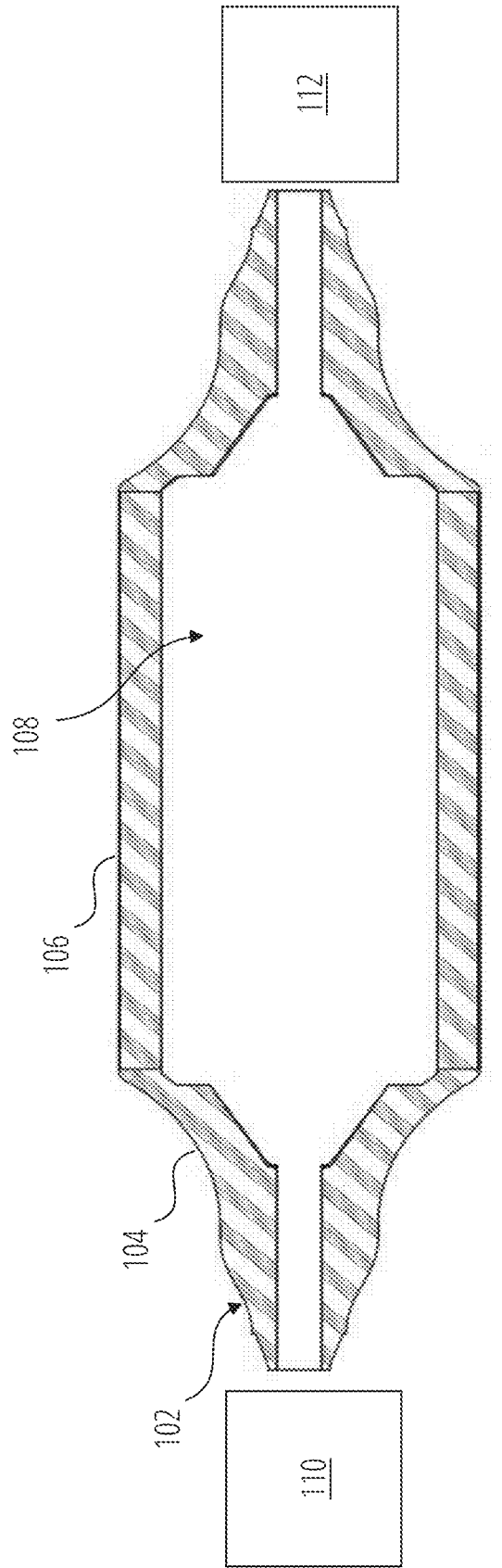
FIG. 1 illustrates an aspect of the subject matter in accordance with one embodiment.

FIG. 1 shows an example of a cable and joint. The cables 110 and 112 may be coupled in the same way at each end of the cable joint 102. Since the specific details of the coupling of the cable 110 in the joint 102 are not necessary to the understanding of the claimed subject matter, the coupling is described at a high-level of detail and can be accomplished according to industry standards and best practices.

The joint 102 may be undersea optical cable joint that may be operable to provide cable-to-cable coupling of two undersea cables, such as 110 and 112. The undersea optical cable joint 102 may be a joint available, for example, from SubCom, LLC under the name Millennia® Joint (MJ). The two undersea cables may each include an inner conductor (not shown in this example).

In this example, the cable joint 102 include a joint housing 108 that is configured to contain splice equipment for splicing conductors of a cable. The cables 110 and 112 may be electrical cables, optical cables that may include an electrical conductor, and the like. In addition, the cables 110 and 112 may be undersea cables, subsea cables, terrestrial cables, non-optical cables or the like.

The joint housing 108 may be an inner housing surrounded by insulating and protective material. The joint housing 108 may contain splice equipment for splicing optical fibers from the cables 110, 112 (when optical fiber cables), or electrical conductors of the cables 110, 112 (when the cables 110 and 112 are electrical cables or when the cables 110 and 112 are optical fiber cables in which the electrical conductors may be joined).

The cables 110 and 112 may, as is known in the cable industry, include an inner conductive sheath and an outer conductive sheath (not shown). The inner conductive sheath may be terminated using known techniques, for example, using a conical termination member that fits around the inner conductive sheath and within a cable socket body at one end of the joint housing 108.

The joint housing 108 and the end of the cable 110 may be overmolded to form an overmolded insulating portions 104 and 106, for example, from suitable dielectric moldable materials. The overmolded insulating portions 104 and 106 may as known in the industry cover a connection region and a termination of the inner conductive sheath of cable 110 or 112 and may restore the insulation over both the inner conductive sheath of cable 110 or 112 and an outer conductive sheath of cable 110 or 112, thereby isolating both the inner conductive sheath and the outer conductive sheath.

As described herein, the cable inspection system is operable to inspect various types of cables and joints, such as subsea and undersea electrical and fiber optic cables. Examples of fiber optic cables are known to include optical fibers as well as electrical power conducting elements covered with one or more insulation layers. Similarly, electrical cables are known to include one or more electrical power conducting elements with insulation layers. In addition, cable joints may also be made from metals and materials, both natural and synthetic. The respective optical fibers, electrical power conducting elements, and insulation layers, metals and materials of a cable joint are all substantially conducive to x-ray imaging, and hence, to x-ray cable inspection.

Figure 2:
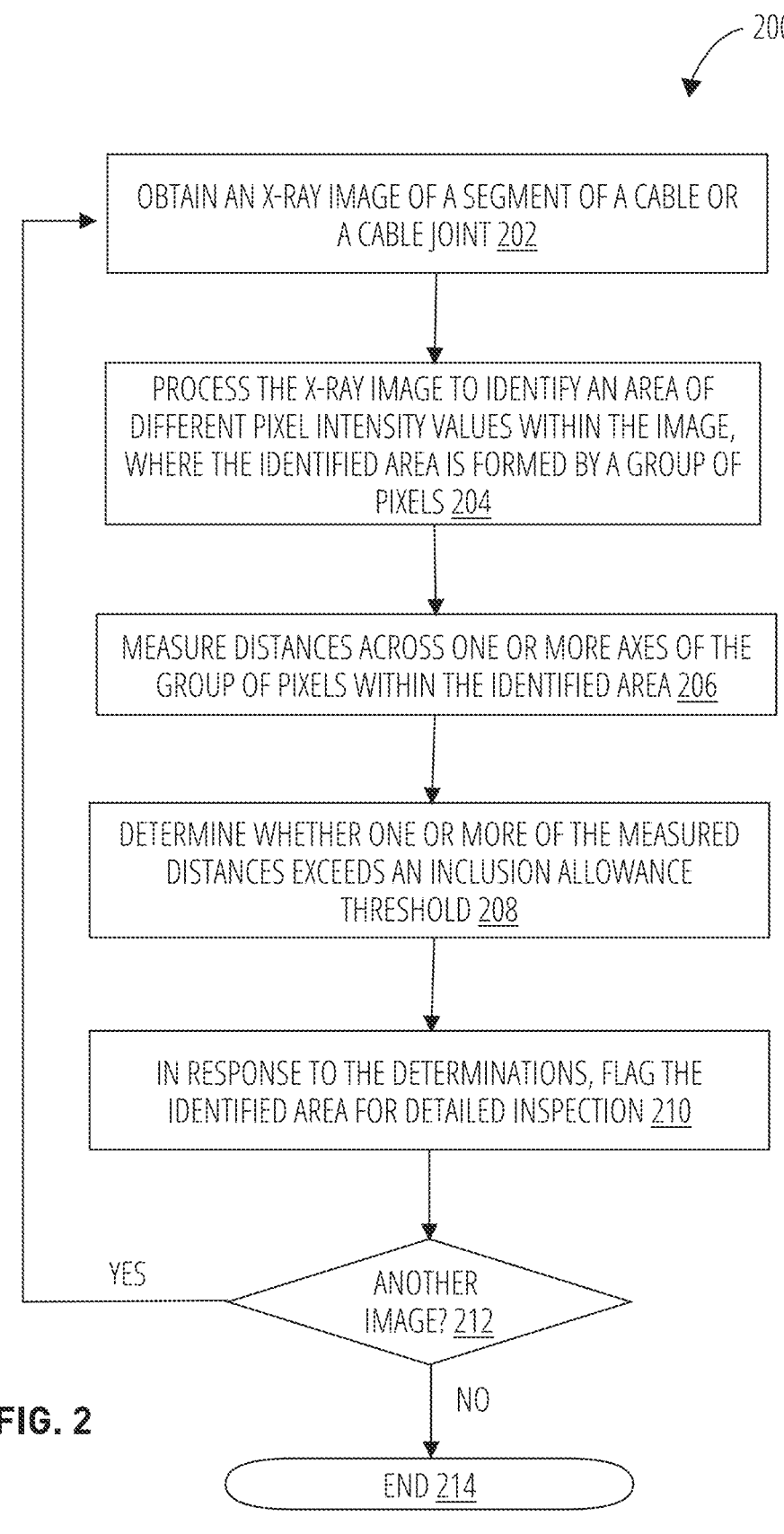
FIG. 2 shows a flowchart of a process for a cable inspection system in accordance with an embodiment.

An example of a cable and joint inspection system may implement a process 200 as shown in FIG. 2 enabling inspection of a segment of a cable or a cable joint. An x-ray camera, which is described with reference to a later example, may be controlled by a processor. As shown in block 202 of process 200, the processor may control the x-ray camera to obtain an x-ray image of the segment of the cable or cable joint. For example, the x-ray camera may be positioned over a point of interest of the segment of the cable or the cable joint. The x-ray camera may obtain a digital image of the point of interest of the segment of the cable or cable joint. The x-ray image obtained by the x-ray camera may include a number of pixels with each pixel of the number of pixels having a respective pixel intensity value and a respective location within the x-ray image.

At block 204, the x-ray image may be processed by the processor using image processing techniques to identify an area of different pixel intensity values within the image. The identified area may be formed by a group of pixels. The identified area may refer to a group of pixels in an x-ray image having different pixel intensity values from other pixels in the x-ray image substantially surrounding the group of pixels. The term "identified area" is analogous to the term "bounded area."

In an example, the group of pixels may be the identified area meaning the group of pixels may be collectively stored in memory as an identified area, such as identified area #123 or the like. The processor may be operable to identify the group of pixels in the x-ray image based on the pixel intensity values of the pixels in the group of pixels being different from pixel intensity values of other pixels in the x-ray image that substantially surround the group of pixels. In an example, the identified area may be identified based on a gradient of pixel intensity values of pixels bounding the group of pixels forming the identified area.

Information associated with each pixel of the group of pixels in the identified area may include coordinates of the respective pixel and a pixel intensity value. In other examples, the information associated with each respective pixel may include the pixel intensity values, coordinates and other information, such as image number when multiple x-ray images are obtained, angular information of the x-ray image with reference to an angular position of the x-ray camera to the segment of the cable or cable joint, longitudinal information of the x-ray image with reference to a longitudinal position of x-ray camera to the segment of the cable or the cable joint. The angular position of the x-ray camera may be around the circumference of the segment of the cable or the cable joint, while the length of the segment of the cable or the cable joint longitudinal position of the x-ray camera may be along the length of the segment of the cable or the cable joint.

Using pixel coordinate values, the processor at block 206, may be operable to measuring distances across one or more axes of the group of pixels within the identified area. For example, the processor may be operable to use coordinates of a first pixel as a first measurement position and use coordinates of a second pixel as a second marked location and measure a distance between the first measurement position to the second measurement position. The processor may set that as a first axial measurement. The processor may be further operable to select coordinates of a third pixel that corresponds to a third marked location of the marked locations within the x-ray image and select coordinates of a fourth pixel that corresponds to a fourth marked location within the x-ray image.

The processor may measure a distance between the third measurement position to the fourth measurement position to obtain a second axial measurement. The number of axial measurements is not limited and may be dependent upon a shape of the boundary or perimeter of the identified area or other factors or settings of the processor. In an example, the axis of the first axial measurement and an axis of the second axial measurement may or may not be coplanar.

Different methods may be used to determine the distance across the identified area, such as utilizing the Pythagorean theorem or if the axis of measurement is a straight line along a coordinate axis, the location may be determined by using a dimension of the pixels forming the image and a count of the number of pixels. For example, if the vertical dimension of a pixel is 0.2 millimeters and the number of pixels that traverse the group of pixels is 5, the measured distance is 1 mm. A scaling factor is used to convert the measured distance to a true distance. Additional discussion of the measuring of the identified area is described with reference to a later example.

At block 208, the processor upon receiving measuring distances across one or more axes of the group of pixels within the identified area, may be operable to determine whether each of the measured distances exceeds an inclusion or void allowance threshold. In an example, each of the measured distances, which may be compared to an inclusion or void allowance threshold, which may be a singular distance measurement or may be a number of distance measurements that are based on different axial measurements. An example of the inclusion allowance threshold may be 0.091 millimeters, 0.457 millimeters, or the like. In addition, or alternatively, the inclusion or void allowance threshold may be different for x-ray images obtained from different longitudinal positions, latitudinal positions, and/or different angular positions (which may also be referred to as "rotational increments"), or a combination of both.

The processor may flag the identified area for detailed inspection in response to the determination that the measured distances exceeds the inclusion or void allowance threshold, at block 210.

After the processor flags the identified area for detailed inspection, the processor may determine whether another x-ray image is available for analysis at decision block 212. If the determination is YES there is another x-ray image available, the process 200 returns to block 202. Otherwise, if the determination is No, there is not another x-ray image available, the process 200 proceeds to done block 214 and process 200 may end.

In addition, the process 200 may include additional functions. For example, the processor may be coupled to a display and be operable to present results of the above functions in the display. The display may be part of a graphical user interface that may present information related to respective x-ray images obtained by the x-ray camera. In the example, the identified area may be presented on the display. Detailed inspection may include further imaging of the segment of the cable or cable joint and/or additional processing of the x-ray images, such as measuring the size of the identified area or the like. The additional processing that may be part of the detailed inspection is described with reference to later examples.

Figure 3:
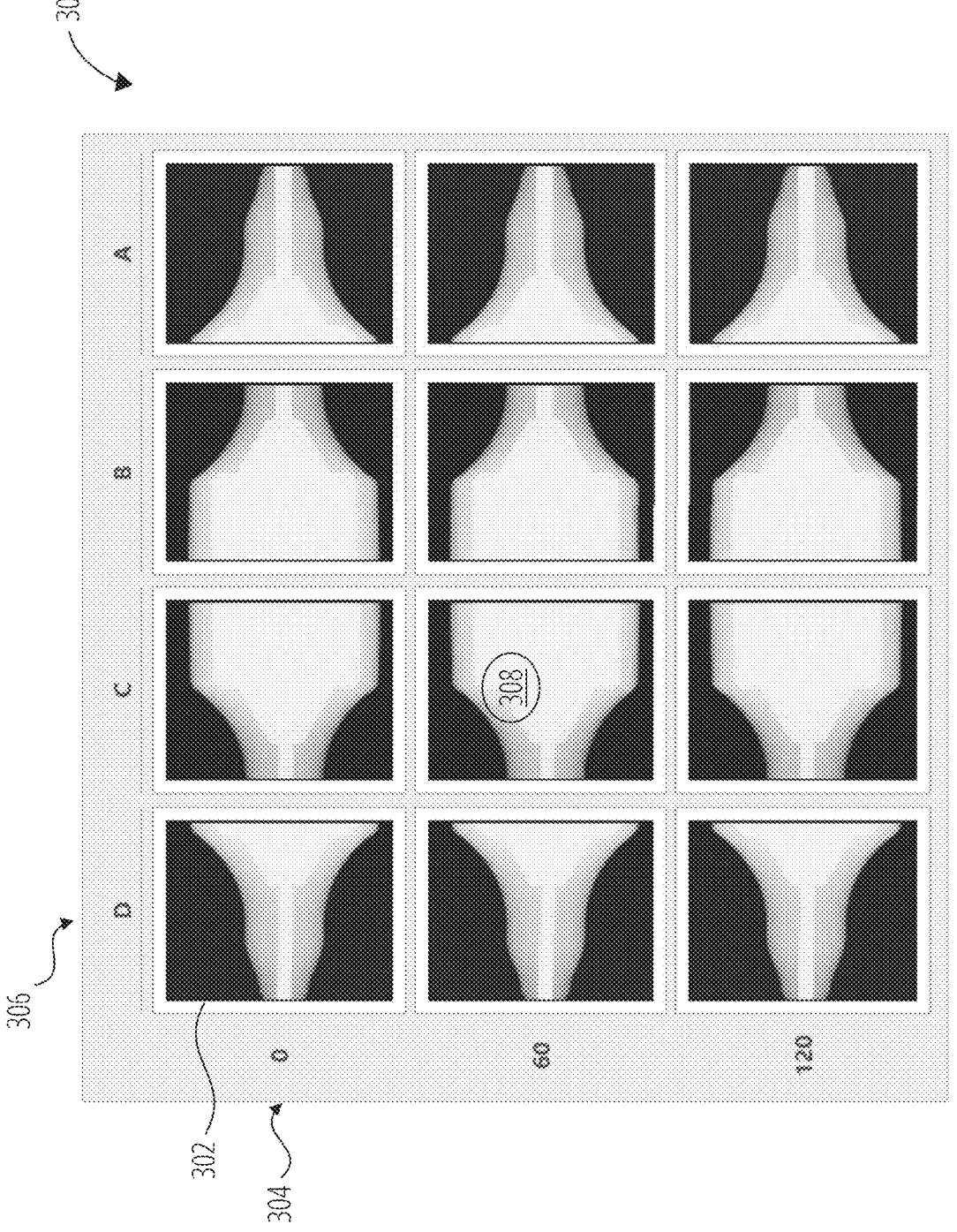
FIG. 3 illustrates an example presentation of examples of x-ray images obtained by an x-ray camera as described herein.

FIG. 3 illustrates an example presentation of examples of x-ray images obtained by an x-ray camera coupled to a controller as described herein. An x-ray image display 300 may be presented by the controller on a display device coupled to the controller (as shown in a later example). The x-ray image display 300 may be configured to present a thumbnail of x-ray image 302 of a cable joint in a matrix. The matrix may be formed with columns of longitudinal axis views 306 and rows of rotational axis views 304. The longitudinal axis views 306 may correspond to longitudinal positions D, C, B and A and the rotational axis views 304 may correspond to angular positions of 0 degrees, 60 degrees and 120 degrees. Of course, the number of thumbnails of x-ray images 302 may be greater or less than the number shown in the example of FIG. 3.

In the example, the thumbnail of x-ray image at longitudinal position C and angular position 60 is shown as having a flagged location 308. The presented image at longitudinal position C and angular position 60 may be selected by an input device or by a touch if the display is a touchscreen display. In response to selection of an image, the controller may be operable to present an increased resolution, or "zoomed" version, as shown in FIGS. 4A and 4B.

Figure 4A:
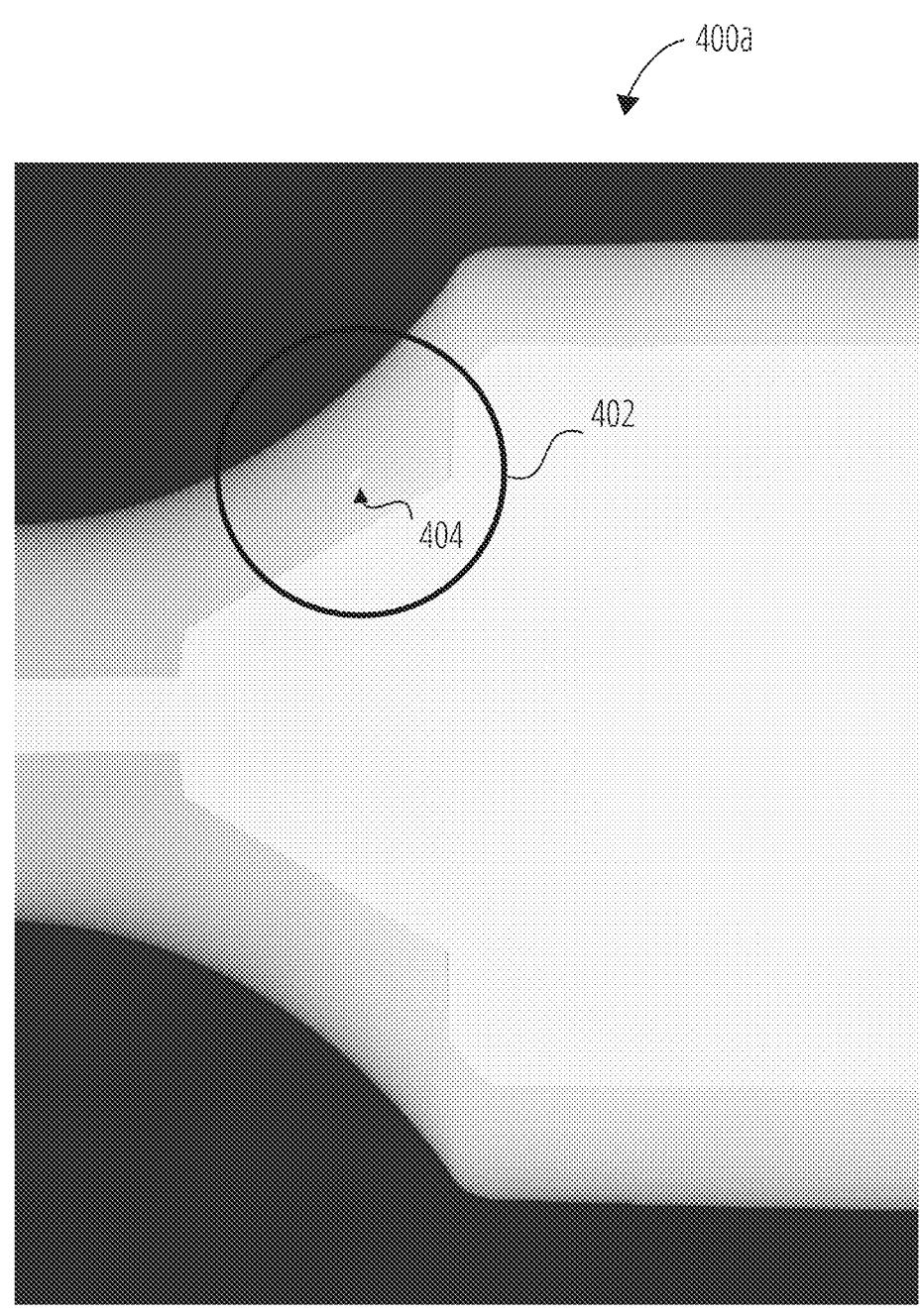
FIG. 4A illustrates an increased resolution x-ray image processed according to the example processes described herein.

FIG. 4A illustrates a zoomed x-ray image processed according to the example processes described herein. The x-ray image 400*a* may include a location identified as an identified area/bounded area 404 by the identified area notification 402. The circular identified area notification 402 may be used to as a focus element when presenting the identified area/bounded area 404 on the display. The identified area/bounded area 404 may only be visible in some of the 12 x-ray images 400*a* in the example of FIG. 3 since the x-ray camera obtains images over a limited arc, such as 60 degrees, and other structures or materials within the cable or cable joint, such as polyethylene insulation, may occlude the inclusion or void from imaging by the x-ray camera.

In an example, the identified area/bounded area 404 may have been identified as an inclusion based on the process 200. The x-ray camera is operable to generate over 14,000 different pixel intensity values, which provides a number of gray scales over which a gradient may be considered. Note the brightness of the identified area/bounded area 404 as compared to the immediately adjacent areas within the identified area notification 402. The controller may be further operable to enable additional increases in resolution as shown in FIG. 4B.

FIG. 4B illustrates a further zoomed version of the x-ray image of FIG. 4A, which has been processed according to the example processes described herein. The zoomed x-ray image 400*b* enables presentation of additional details of the identified area/bounded area 404 within the identified area notification 402 circle. The respective images 400*a* and 400*b* may be used in the process 200 or other processes described herein.

Figure 4C:
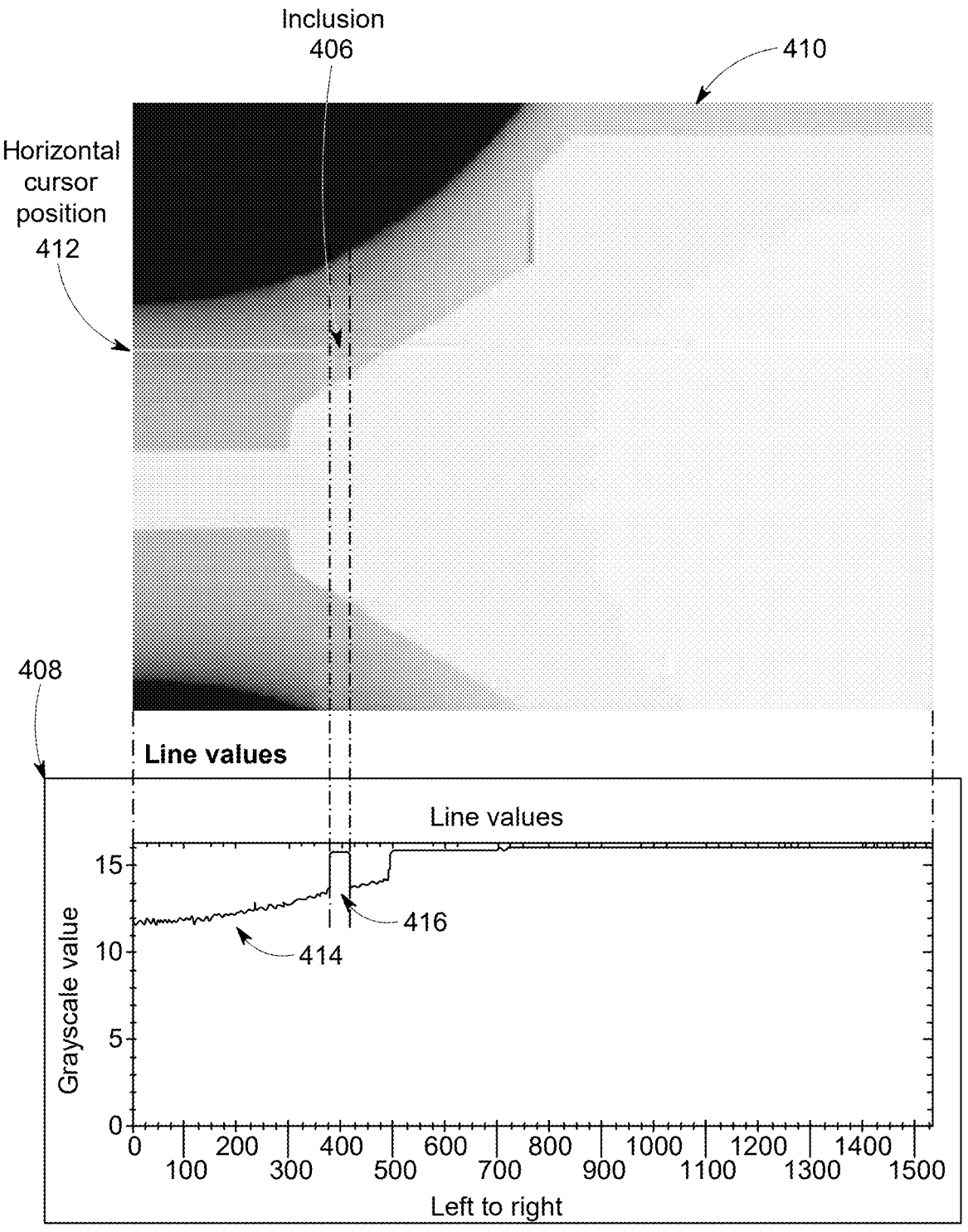
FIG. 4C illustrates an example of an increased resolution image of the x-ray image of FIG. 4A in which the user interface is used to highlight the inclusion/void for evaluation.

FIG. 4C illustrates an example of an increased resolution image of the x-ray image of FIG. 4A in which the user interface is used to highlight the inclusion/void for evaluation. As shown in FIG. 4C, the inclusion 406 is at substantially the same region as identified area/bounded area 404 of FIG. 4A. In FIG. 4C, the line values graphic 408 below the thumbnail 410 is shown as registering higher pixel intensity values as compared to pixels surrounding the inclusion 406 at the horizontal cursor position 412. As shown in the graphic 408 of FIG. 4C, the line values, also referred to as pixel values, to the right of the inclusion 406 have a first grayscale pixel intensity value, such as 12500 while the inclusion has a second grayscale pixel intensity value of 16000 as shown in the graphic 408.

In an example, the processor may scan the pixel intensity values of each line of the thumbnail 410 to determine whether there is a rapid increase or change in gradient of the pixel intensity values. The gradient 414 of the pixel values leading to the pixels representing the inclusion indicate a gradual change of gradient between adjacent pixel intensity values. In contrast, the rapid increase in pixel intensity values at 416 indicates a steep or rapid change of gradient. The gradient in pixel values changes from approximately 12500 prior to 416 to 16000 at 416, where 416 corresponds to the inclusion 406. In the example, the gradient threshold may be 3000 or some other number, which indicates a rapid change in grayscale pixel values between particular pixels.

Figure 5A:
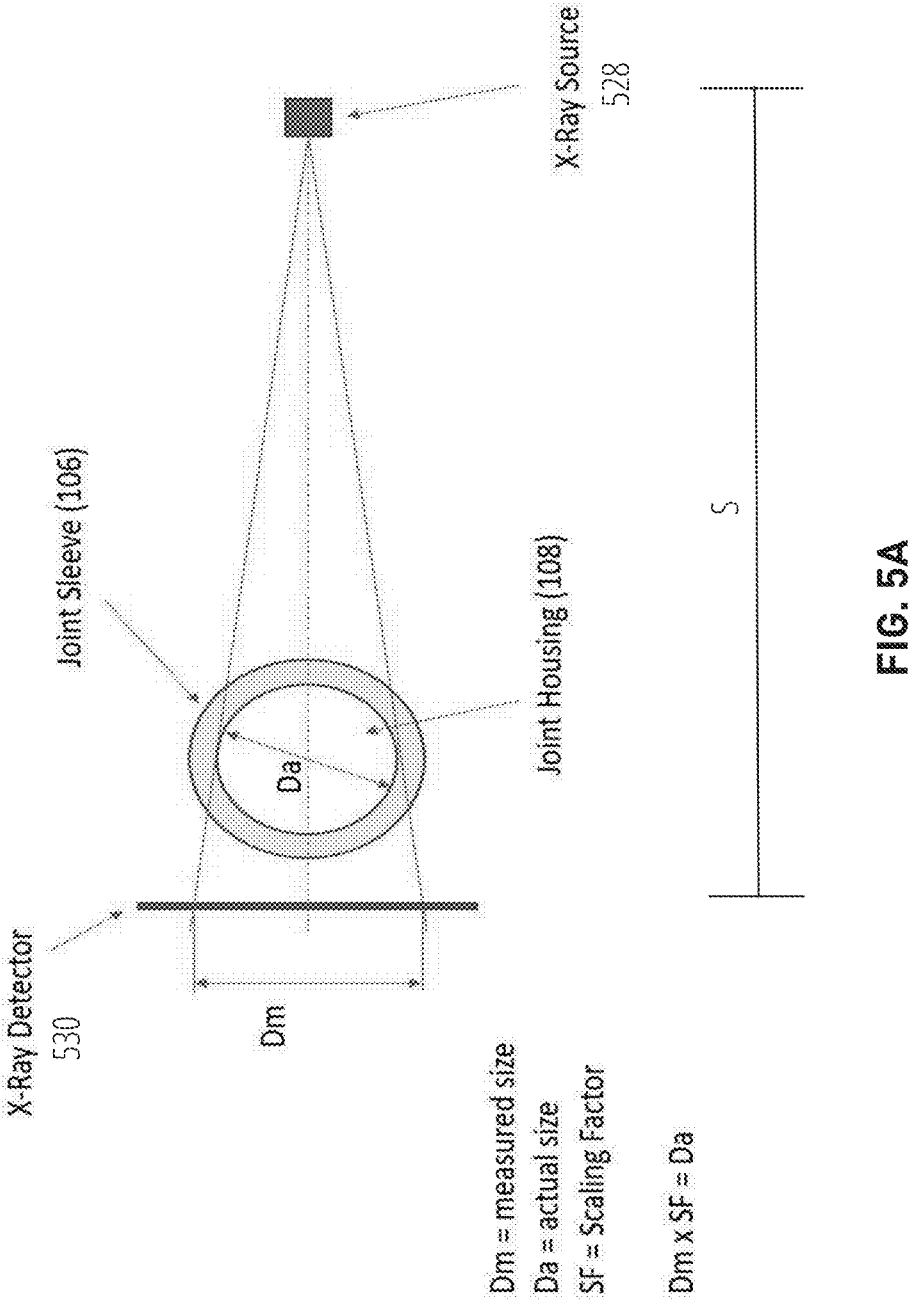
FIG. 5A shows a graphic illustrating functional arrangement of the x-camera for determination of a true measurement of a portion of an x-ray image being evaluated.

FIG. 5A shows a graphic illustrating functional arrangement of the x-camera for determination of a true measurement of a portion of an x-ray image being evaluated. In FIG. 5A, the x-ray source 528 is a distance S from the x-ray detector 530 within an x-ray camera usable with the examples described herein. The x-ray detector 530 may be responsive to x-ray energy output by the x-ray source 528. The signals output from the x-ray detector 530 may be used to generate a grayscale image representative of an intensity of the x-ray energy detected by elements of the x-ray detector 530. As shown in FIG. 5A, a joint including a joint sleeve, such as 106 of FIG. 1, and a joint housing, such as 108 of FIG. 1, is being imaged. The actual diameter (or size) of the joint housing is Da, but the measured size using the detector pixel dimensions, is Dm. As a result, in order to obtain a true measurement of the size of any detected object, inclusion or void, the measured size must be multiplied by a scaling factor SF to obtain the actual size, or true measurement of the object, inclusion or void. The scaling factor maybe based on the distance S of the x-ray source 528 from the x-ray detector 530. In this exemplary arrangement of the x-ray source 528 and x-ray detector 530, the scaling factor SF is less than ($<$) 1.0. For example, if the diameter of the joint housing was to be measured, the processor may multiply Dm by SF to obtain Da, the true measurement of the diameter of the joint housing.

Figure 5B:
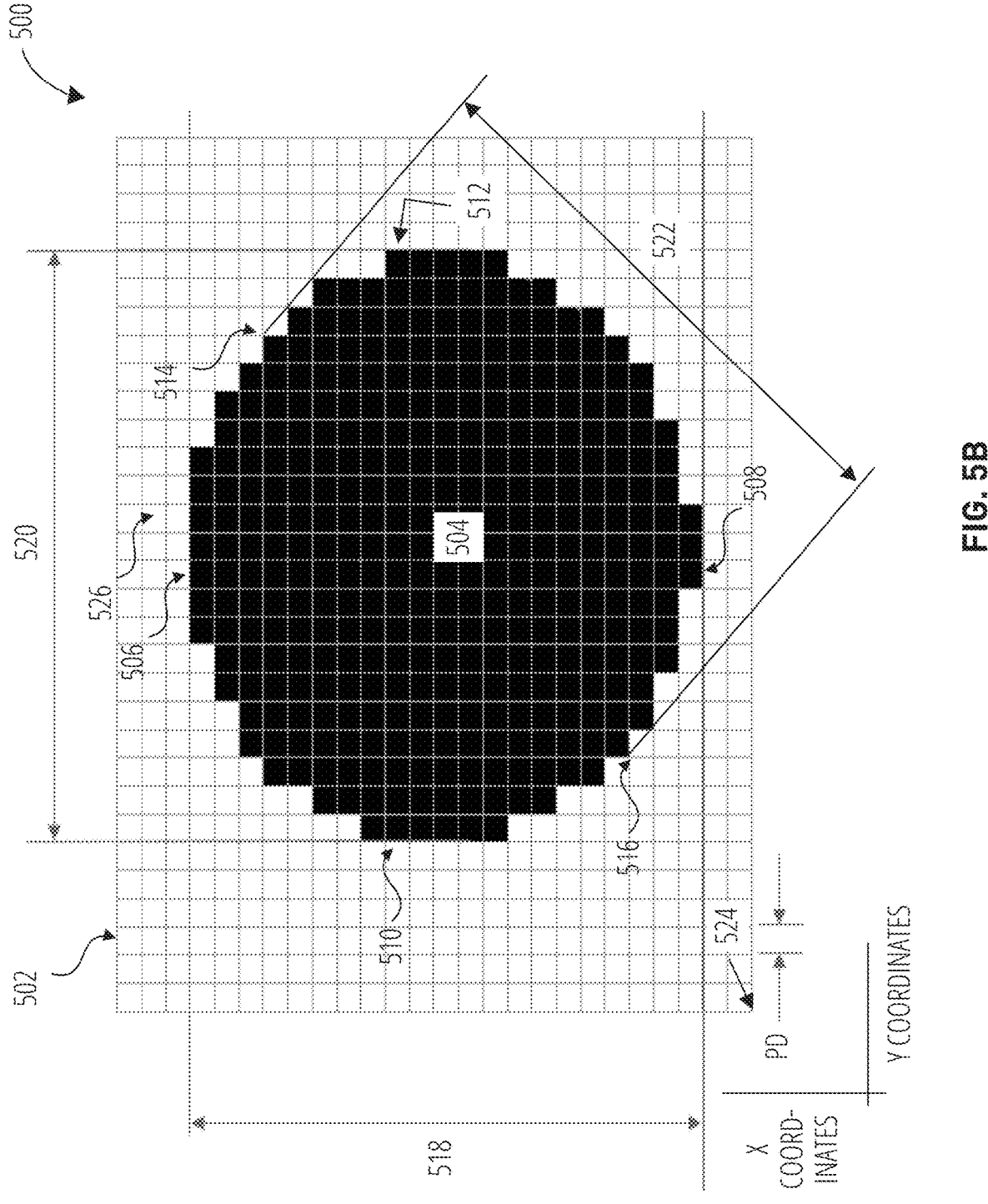
FIG. 5B shows an example of a bounded area in a portion of an x-ray image for further explanation of the processing performed to measure the bounded area according to examples of the disclosed subject matter.

FIG. 5B shows an example of a bounded area in a portion of an x-ray image for further explanation of the processing performed to measure the bounded area. "Bounded area" may refer to a group of pixels in an x-ray image having different pixel intensity values from other pixels in the x-ray image substantially surrounding the group of pixels. The term "bounded area" is analogous to the identified area of an earlier example. The portion of an image 500 shows a bounded area 504. The bounded area 504 is shown on a matrix of individual pixels 502 having a predetermined number of rows and columns. In this example, the matrix has 26 rows in the X axis and 31 columns in the Y axis. In the example, each pixel 502 is presumed to be square and have a horizontal dimension and vertical dimension that are both equal to a pixel dimension (PD). Of course, the pixels 502 may be rectangular or another shape. The bounded area 504 may have a height 518, width 520 and an angular axis dimension 522. The limits of the height 518, width 520 and angular axis dimension 522 may be determined precisely by the processor when processing the entire x-ray image of which the portion of an image 500 is only a part.

In an additional example, the processor may be operable to determine that the x-ray image includes two or more identified bounded areas, such as two of bounded area 504. The processor may be operable to measure a distance between each respective pair of the two or more identified bounded areas. The processor may evaluate the measured distance between each pair with respect to a minimum allowance. In response to the measured distance being less than the minimum allowance, the processor may flag the x-ray image for detailed inspection. In addition, or alternatively, a user interface may, in response to more than one inclusion or void detected, in response a command from the processor be operable to provide an indication when the distance between any two of the more than one inclusion or void are closer to one another than a predetermined allowance.

As described with reference to block 206, the cable inspection system may use multi-axial measurements to determine a size of an area bounded by the locations marked as locations where a gradient threshold has been exceeded. Based on the measurements made according to the following processes, a size of bounded area may be determined, and the determined size of the area may be compared to an inclusion or void allowance threshold. The inclusion or void allowance threshold may have multiple thresholds, such as a first threshold related to a height of the inclusion or void, a second threshold related to a height of the inclusion or void, a third related to an angular axis dimension of the inclusion or void, and the like. In response to a result of the comparison indicating that the inclusion or void allowance threshold has been exceeded, the processor may flag the bounded area as an inclusion or void.

In the example of FIG. 2, when measuring distances across one or more axes of the group of pixels within the identified or bounded area 504, the processor may use the number of pixels to measure the distance. Note that the example portion of an image 500 is for illustration purposes and that an actual portion of x-ray image may include hundreds of thousands to millions of pixels, which cannot reasonably be counted without aid of a processor.

For the simple example of FIG. 5B, the height 518 provides an axial measurement in the vertical axis. The height 518 may be determined by the resulting value of X times PD=actual bounded area 504 size in the vertical plane, where X is the number of pixels 502 in the vertical direction of the bounded area 504 and PD is the pixel dimension. In the example, X is equal to 21 and PD may be equal to 2 mm, so bounded area 504 may have a height 518 of 42 mm. In the same example, width 520 is an axial measurement in the horizontal axis. The width 520 may be determined by the value of Y times PD, which equals the actual bounded area 504 size in the horizontal plane, where Y is the number of pixels 502 in the horizontal direction of the bounded area 504 and PD is the pixel dimension. In the example, Y also is equal to 21 and PD may be equal to 2 mm, so bounded area 504 may have a width of 42 mm.

In the process 200, the two dimensions, height 518 and width 520, may be evaluated against an inclusion or void allowance threshold to determine whether bounded area 504 is an inclusion or void. However, in addition to height 518 and width 520, the angular axis dimension 522 may also be considered. However, since angle across the bounded area 504 may not lend itself to easily allow counting of a precise number of pixels 502. The processor may utilize pixel coordinates, which may be expresses according to either the matrix coordinate system (i.e., top-left corner is the origin) or the image coordinate system (i.e., bottom-left corner is the origin).

As shown in the example portion of an image 500, the gradient (change from a first pixel intensity to another pixel intensity, which in this case is from white to black) may be determined to be exceeded at a first measurement position 506 because the processor determines the pixel intensity gradient is substantially white from pixel 526 until reaching a pixel near the first measurement position 506. The processor may determine the change in the gradient of the pixel values from a first grayscale value (in this case, white) to a second grayscale pixel value (in this case, black) that exceeds a gradient threshold value. For example, as described above with reference to FIG. 4C, the gradient threshold value may be 3000, but other values, such as 2500 or even less, such as 1000, may be selected based on the materials being imaged or the tolerance of the material to withstand the presence of some imperfections or discrepancies. In addition, the gradient threshold may also depend upon the sensitivity of the x-ray detector, such as 530, of the x-ray camera.

The processor, in response to the determination that the gradient threshold value has been exceeded, may identify a pixel corresponding to the change in the gradient of pixel values as an edge of the bounded area. In the example, the processor may measure the size of the bounded area 504 in the portion of an image 500 using coordinates of a first pixel that corresponds to a first marked location, such as first measurement position 506, of the marked locations within the x-ray image. In this example, the origin 524 is located in the bottom-left corner. The first measurement position 506 may have a first set of coordinates (e.g., 24,16). A second pixel that corresponds to a second marked location of the marked locations within the x-ray image 500 where the gradient exceeds the gradient threshold may be selected as a second measurement position 508. The coordinates at second measurement position 508 may be (3, 16). Using the Pythagorean Theorem, the distance (i.e., height 518) may be approximately equal to 21 mm.

Subsequently, coordinates of a third pixel that corresponds to a third marked location of the marked locations within the x-ray image may be selected, such as third measurement position 510. The third measurement position 510 may be a location in the portion of an image 500 where the gradient exceeds the gradient threshold. The coordinates of the third measurement position 510 may be (6, 12). A fourth marked location of the marked locations within the x-ray image, where the gradient exceeds the gradient threshold may be fourth measurement position 512. The coordinates of fourth measurement position 512 may be selected (i.e., x=27, y=12)). The processor may measure the distance (i.e., width 520) between the third measurement position 510 to the fourth measurement position 512 as being approximately equal to 21 mm. The measured distance between the third measurement position 510 and the fourth measurement position 512 may be considered a second axial measurement.

The processor may select coordinates of a fifth pixel as a fifth measurement position 514 that corresponds to a fifth marked location of the marked locations within the x-ray image 500. The fifth measurement position 514 may be a pixel where the gradient exceeds the gradient threshold. The coordinates of fifth measurement position 514 may be (21, 24). A sixth marked location of the marked locations within the x-ray image 500 may be selected as a sixth measurement position 516. The coordinates of the sixth measurement position 516 may be (6, 10). The measured distance between the fifth measurement position 514 and the sixth measurement position 516 is approximately equal to 21 mm. The measured distance between the fifth measurement position and the sixth measurement position is a third axial measurement along a third axis. The third axis is non-coplanar with the axis of the first axial measurement and the axis of the second axial measurement.

Figure 5C:
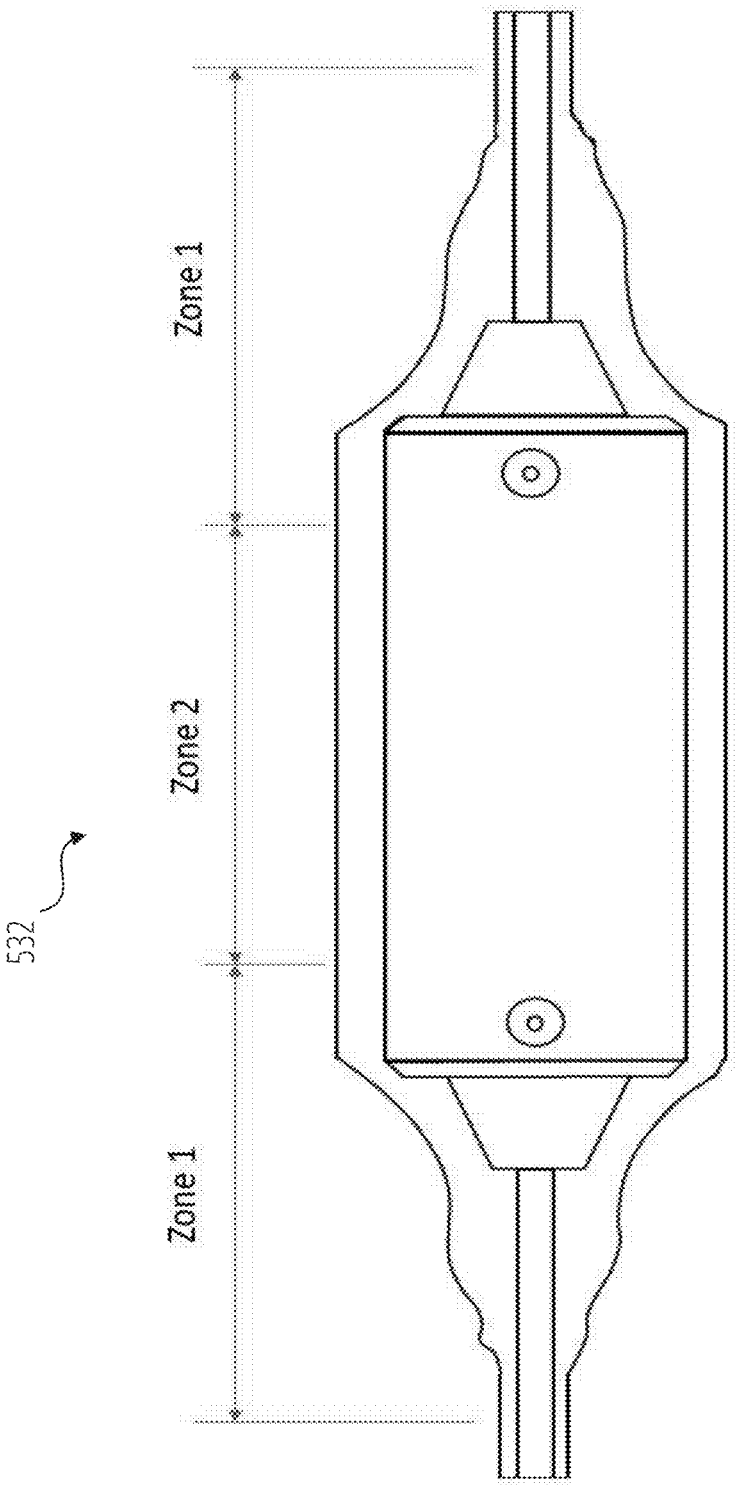
FIG. 5C shows an example of risk zones of a joint indicating where locations of inclusions or other anomalies present a higher risk.

FIG. 5C shows an example of risk zones of a cable joint indicating where locations of inclusions or voids present a higher risk. In the example of FIG. 5C, the cable joint 532 or cable segment may be divided along its length into different zones of risk. For example, inclusions or voids in Zone 1 on either end of the cable joint 532 may be higher risk and therefore, have different a gradient threshold as well as different void or inclusion allowance thresholds than Zone 2. Alternatively, the gradient thresholds and void or inclusion thresholds may remain the same for each zone over the entirety of the cable joint 532 or cable segment. In an example, the processor when noting a potential inclusion in Zone 1, which has a higher risk setting than Zone 2, may include additional alerting features, such as causing a thumbnail to flash or highlight the thumbnail in a different color (e.g., red) from other thumbnail images, or the like.

The determination of whether the inclusion is in Zone 1 or Zone 2 may be based on a longitudinal, latitudinal or angular rotation setting input into the system or set by default for a respective type of joint. For example, zones of an MJ joint may be different from other types of joints. In addition, the settings of the dimensions of the zones may be customizable given the object being imaged.

For example, each zone (e.g., Zone 1 or Zone 2) may represent a different longitudinal position and angular position that corresponds to a thumbnail, such as 410 of FIG. 4C. For example, it may be allowable to have more than one inclusion or void adjacent to each other provided the size and spacing between them meets the criteria for a particular area of the cable joint (e.g., Zone 1 or Zone 2).

In addition, or alternatively, there may be several zones, such as Zones 1-4, with each zone having different gradient thresholds and inclusion or void allowance thresholds depending upon default settings or inputted settings.

The simplistic examples of FIGS. 5A-5C illustrate the complexity of the image processing programming and identifying the respective marked locations within an image for determining whether an inclusion or void is present within the respective segment of a cable or cable joint.

FIG. 6 illustrates another example of a process for inspecting a segment of a cable or a cable joint.

In block 602, a processor implementing process 600 may be operable to obtain an x-ray image of a segment of a cable or cable joint. The x-ray image may include a number of pixels with each pixel of the number of pixels having a respective pixel intensity value.

In block 604, the processor may apply an image processing algorithm that processes the x-ray image to identify an area within the image, where the identified area is formed by a group of pixels. For example, the image processing algorithm may be operable to utilize a gradient of pixel intensity values in the identification of pixels bounding a group of pixels forming an identified area.

In block 606, processor may be operable to measure distances across one or more axes of the group of pixels within the identified area. The processor may utilize one or more measuring techniques, such as those discussed above with reference to FIG. 5. The measurement along each of the one or more axes may be referred to as an axial measurement.

In block 608, the processor may determine whether one or more of the measured distances exceeds an inclusion or void allowance threshold. For example, the processor may compare each of the one or more measured distances to an inclusion or void allowance threshold. Examples of the inclusion or void allowance threshold may be 0.091 mm, 0.457 mm, or the like. All of the axial measurements may be evaluated against a single inclusion allowance threshold, such as 0.091 mm. In addition, each zone as shown in FIG. 5C, for example, may also have its own inclusion or void allowance threshold.

In block 610, the processor may, based on one or more of the measured distances exceeds the inclusion or void allowance threshold, flag the identified area for detailed inspection.

In a further example, the detailed inspection may include the processor selecting an updated longitudinal position and/or an updated angular position with respect to the flagged identified area in the segment of the cable to obtain another x-ray image. The processor may be operable to automatically select the updated longitudinal position or the updated angular position. For example, instead of D, C, B or A, the processor may be operable to select an updated longitudinal position between D and C for further imaging, if the identified area is in an x-ray image at C and 60 degrees, for example. Alternatively or in addition, the processor may be operable to select an updated angular position between 60 degrees and 0 degrees (and/or 60 degrees and 120 degrees) for further imaging, if the identified area is in an x-ray image at C and 60 degrees, for example.

In addition, the processor may be operable to control the X-ray camera to obtain the further x-ray image at the updated longitudinal position and/or the updated angular position and process the further x-ray image to locate the identified area within the further x-ray image. The processing of the further x-ray image may include locating the change in the gradient in the further x-ray image and confirming that change in gradient occurs at a pixel location included at an approximate boundary of the identified area.

Figure 7A:
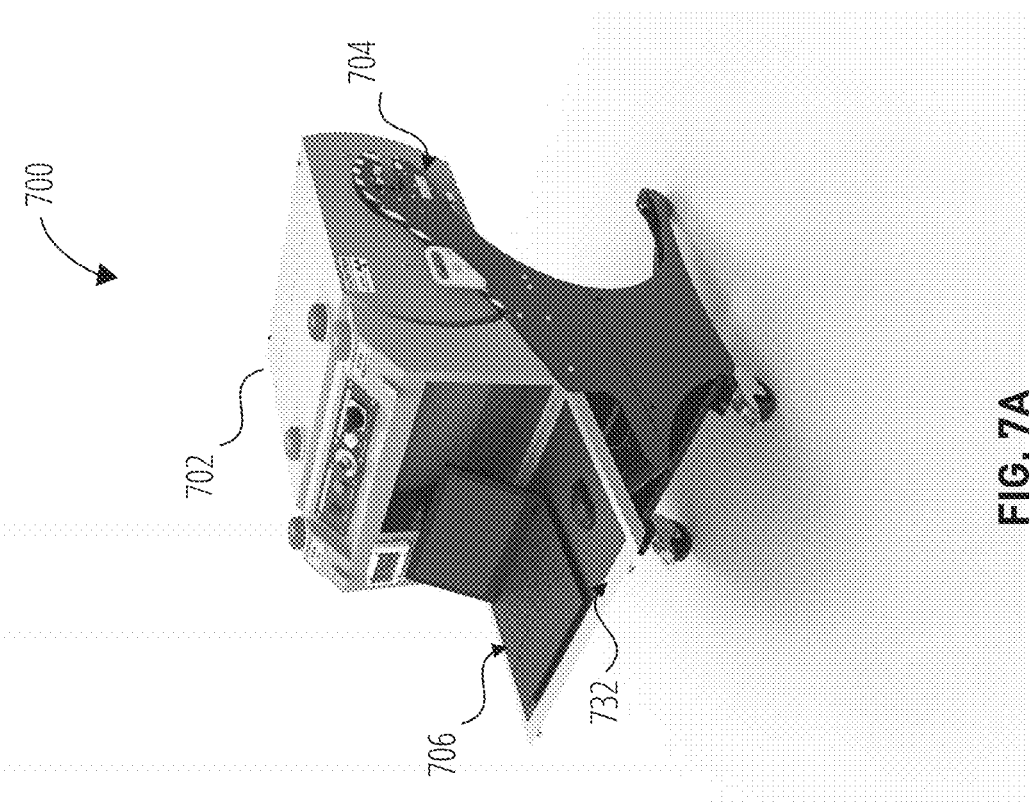
FIG. 7A illustrates an isometric view of an example of a cable inspection system.

FIG. 7A illustrates a plan view of an example of a cable inspection system. The cable inspection system 1100 includes an x-ray cabinet 702, a gimbal 704, user interface 706 and a shelf 732. The x-ray cabinet 702 may be operable to house an x-ray camera, a gimbal control and a longitudinal control (shown in a later FIG.) as well as respective circuitry and mechanical elements (such as motors, gears and the like).

The shelf 732 is shown in a lowered position with user interface 706 positioned on the shelf 732. The x-ray cabinet 702 rotates about the gimbal 704, while the shelf 732 remains stationary.

Figure 7B:
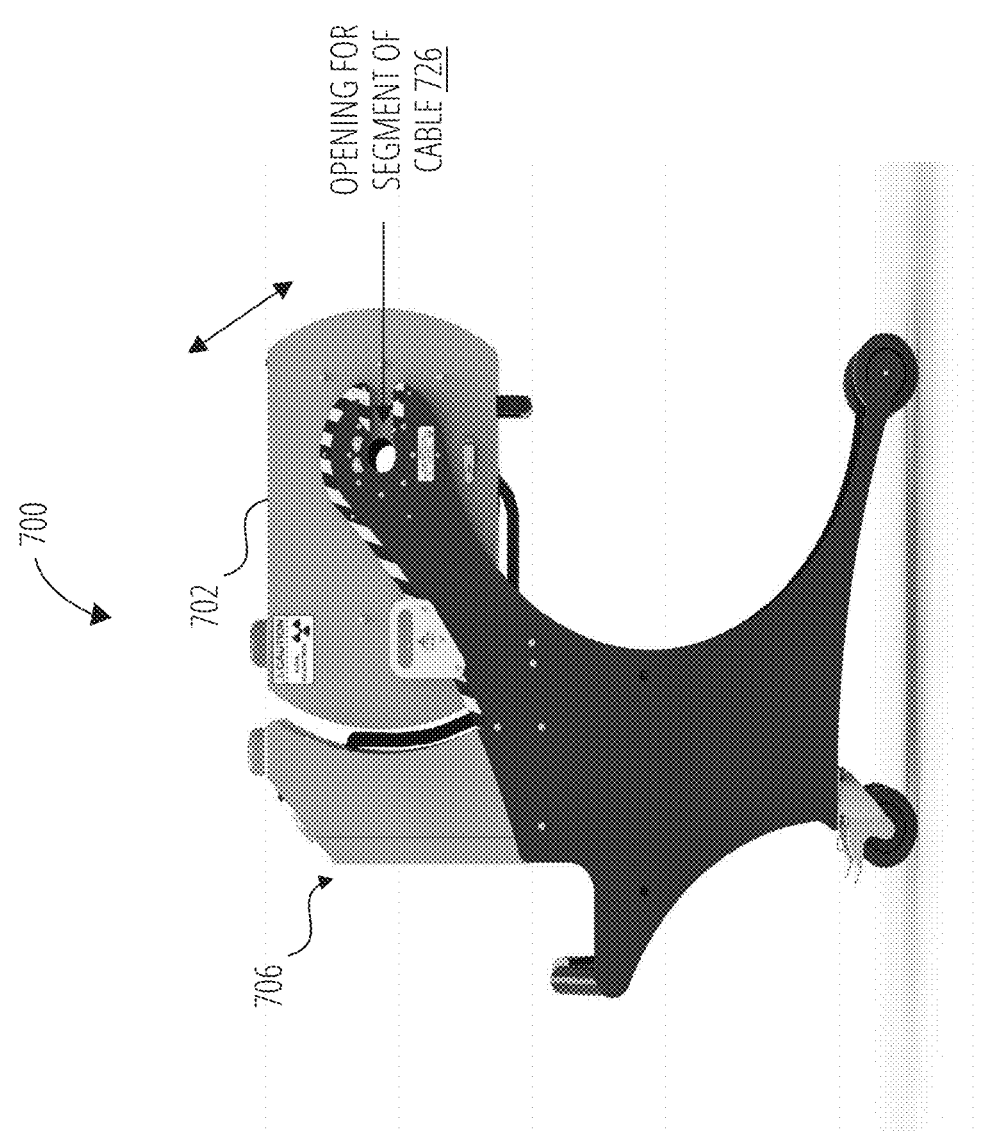
FIG. 7B illustrates a side view of the example of the cable inspection system.

FIG. 7B illustrates a side view of the example of the cable inspection system. The undersea cable inspection system 700 is shown with the shelf 732 in the closed position. The x-ray cabinet 702 may rotate according to the two-headed arrow to position x-ray camera around the cable/cable joint. The cable/cable joint may be positioned in an opening 726 for the segment of the cable through the cabinet 702.

Figure 7C:
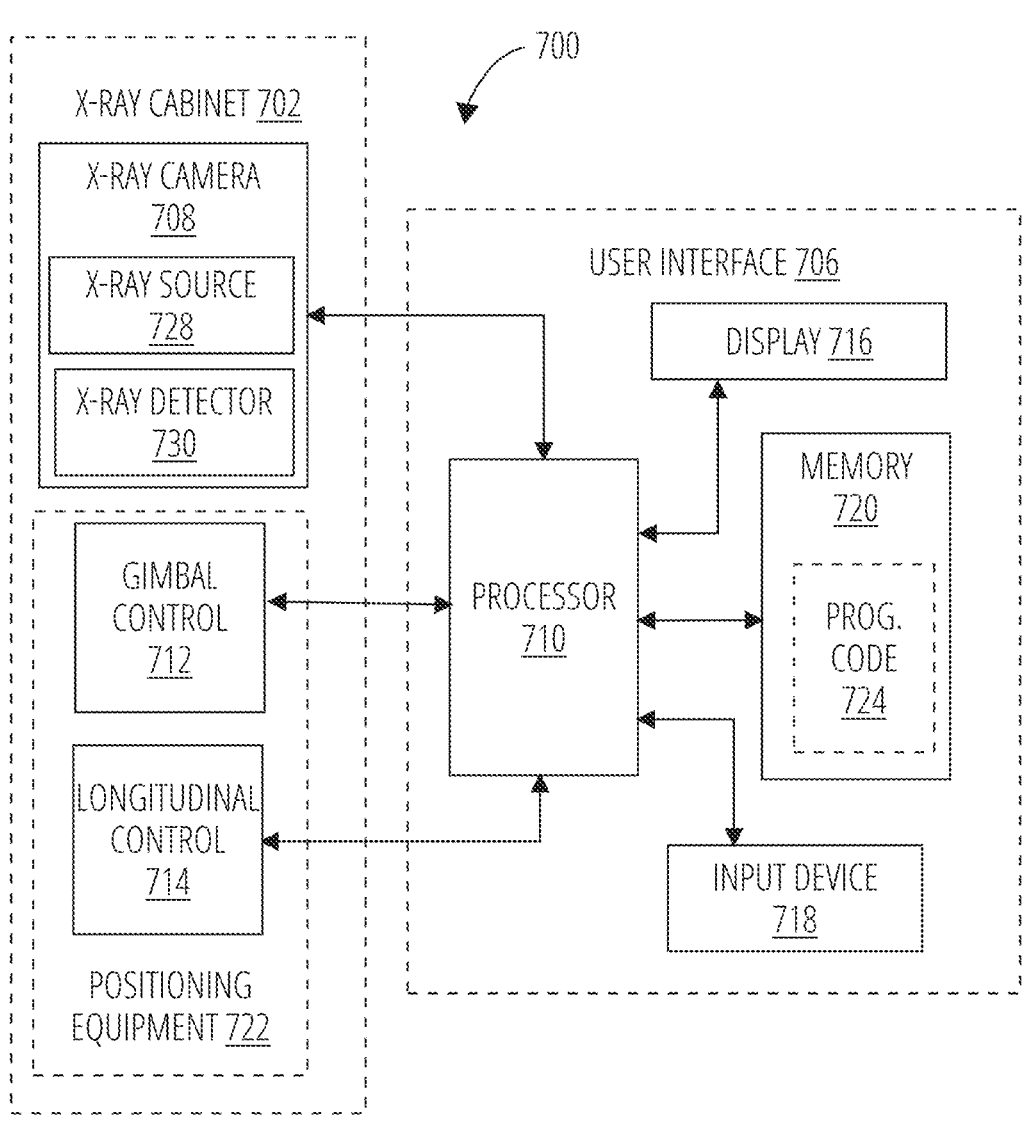
FIG. 7C illustrates a functional block diagram of the example of the cable inspection system shown in FIGS. 7A and 7B.

FIG. 7C illustrates a functional block diagram of the example of the cable inspection system shown in FIGS. 7A and 7B. The undersea cable inspection system 700 may include the x-ray cabinet 702 and user interface 706 the user interface 706. The x-ray cabinet 702 may contain the x-ray camera 708 and positioning equipment 722. The positioning equipment 722 may include the gimbal control 712 and the longitudinal control 714 and may be operable to position the x-ray camera 708 at a location to obtain an image of a cable or a cable joint positioned between the x-ray source 728 and the x-ray detector 730.

The user interface 706 may be operable to control the x-ray camera 708, the gimbal control 712 and the longitudinal control 714. The gimbal control 712 may include mechanical components, such as gears, motors, circuitry, and the like (not shown) that are controllable to rotate the x-ray cabinet 702 as well as the x-ray camera 708 to obtain images of a cable/cable joint enclosed in the x-ray cabinet 702. The rotation of the gimbal 704 may be operable to automatically rotate in approximately 1° increments over a rotational range of approximately 0°-180°. Of course, different increments and a different range of rotation may be selected.

The user interface 706 may include a processor 710, a display 716, an input device 718 and a memory 720 including programming code 724. The processor 710 and memory 720 may be a programmable logic controller (PLC) that is operable to control the x-ray source 728 and x-ray detector 730 of the x-ray camera 708. For example, the processor 710 may be operable to execute programming code 724 to perform the processes, techniques and functions described herein to provide the cable inspection system.

The user interface 706 may be operable to execute the programming code 724 stored in the memory 720 that enables the controller to cause the x-ray camera 708 to automatically capture a series of X-ray images at multiple longitudinal positions and user defined (or automatically selected) rotational increments to examine the entire joint and reduce parallax issues. The automated processing described with reference to the earlier examples delivers unique repeatability by eliminating the need for manual rotations and user interaction. It accelerates the process while improving accuracy.

The processor 710 may be communicatively coupled to the x-ray camera 708 and the positioning equipment 722. The memory 720 may be coupled to the processor 710 and may be operable to store programming code 724 to control the x-ray camera 708 and the gimbal control 712 and the longitudinal control 718 of the positioning equipment 722. For example, the processor 710, when executing the programming code 724, may be operable to actuate the positioning equipment to position an aperture of the x-ray camera 708 over a number of selected portions of the undersea cable, obtain an x-ray image at each selected portion of the number of selected portions of the undersea cable. The processor 710 may be operable to perform the various processes as described herein.

In an operational example, the processor 710 may be operable to control the x-ray camera 708 to obtain a number of x-ray images of a segment of a cable or cable joint. Each x-ray image may be an image of a respective longitudinal position and a respective angular position of the segment of the cable or cable joint. The processor 710 may use the programming code 724 to process each x-ray image of the number of digital images to identify a change in a gradient of the pixel values at the respective longitudinal position and the respective angular position within the x-ray image. The processor 710 may further identify, in at least one respective x-ray image for each processed x-ray image, a change in the gradient at the respective longitudinal position and the respective angular position within the at least respective x-ray image, determining whether the change in the gradient of the pixel values is at an unexpected location within the respective x-ray image. The processor 710 may flag the unexpected location within the at least one respective x-ray image. Based on the flag, the processor 710 may select an updated longitudinal position and an updated angular position with respect to the unexpected location to obtain another x-ray image of the segment of the cable or cable joint. The x-ray camera 708 may be controlled to obtain a further x-ray image of the segment of the cable or cable joint at the updated longitudinal position and updated angular position. The processor 710 may perform the processing, the determining and the flagging using the further x-ray image.

The different joint technologies may have different pass/fail criteria for an inclusion or void or where that inclusion or void is physically located with the molded region. The joint may also be a customized joint that may have proprietary details and pass-fail limits and the like. The programming code 724 may include an optional feature that enables customization of the cable and cable joint profiles allowing users to add new joint technologies without sharing proprietary information with 3rd parties and add new cable types as needed. The proprietary details and pass-fail limits may be entered via the input device 718 into the user interface 706 for storage in the memory 720 as settings usable by the programming code 724.

In addition, the automatic rotation of the x-ray camera 708 may be customized in 1° increments (0-180°) and zones of a cable or cable joint may be selected/deselected as required. Users can customize X-ray configurations by setting different voltages, shutter speeds and detector offsets at each zone to reduce parallax issues. The x-ray camera 708 is also configured to provide a live streaming feature that allows for real time detailed investigation into specific areas of a cable or cable joint. Unique alignment feature allows joint to be placed anywhere in the cabinet. Using the 'Program Manager Software' a user may design their own presets related to different polymers with different material densities of the user's specific cable or cable joint. The presets may allow the user to set the exposure time and high voltage settings for the x-ray camera 708 (akin to a regular visual light camera—such as shutter speed, ISO file speed, etc.) from the default values. In addition, the physical size of a $3^{rd}$ party's joint may differ from the default cable joint size so the longitudinal positions (DCBA locations) might differ, so the longitudinal control 714 enables positioning of the x-ray camera 708 at custom locations. The longitudinal control 714 may also be operable to perform latitudinal positioning of the x-ray camera 708, if required or requested, with respect to the cable or cable joint. In addition, the gimbal control 712 enables changes to the angular position of each series of images, beyond the 0°, 60° and 120° positions described in the examples. In addition, the user may select settings for gradient thresholds and inclusion or void allowance thresholds, identify zones and the dimensions of the zones, and the like.

In addition, the user may request a customized camera beyond the x-ray camera 708 to be provided that also interfaces with the programming logic and programming code stored in the memory 720. For example, the custom camera may be a camera that images in a different part of the spectrum from x-ray, such as infrared or the like.

It may be understood that the above-described cable inspection system 700 can be arranged in various and different arrangements and may not be limited to any particular arrangement or in any other manner.

The cable inspection system described herein may be used on ships and in cable factories or other areas where such an inspection process is required, such as a development lab and the like.

In other examples, the processor may be operable to identify the area formed by a group of pixels even though the identified area is not completely surrounded by pixels having different pixel intensity values. For example, the inclusion or void may be at an angle in the image that in which a boundary of the inclusion or void is blocked from view. For example, the identified area may not be completely surrounded by pixels having different intensity values or a changed gradient that meets a threshold gradient change. In response to this situation, the processor may determine that the particular area of concern may be subject to imaging at additional angular positions such as 0°, 30°, 60° or the like depending upon the segment of cable being imaged or the like.

The limits for the gradient threshold may vary depending upon whether an inclusion or a void is suspected as being detected as well as considerations for the different materials being imaged. For example, a gradient threshold for a void may be a pixel intensity values indicating overexposure, such as 16000, for an inclusion may be an underexposure of 2000 with boundary layers of polymers (at surfaces of joints or surfaced of metallic components) being somewhere between the 2000 and 16000 pixel intensity values.

The various elements of the devices, apparatuses or systems as previously described with reference to FIGS. 1-5 and 7A-C may include various hardware elements, software elements, or a combination of both. Examples of hardware elements may include structural members, logic devices, components, processors, microprocessors, circuits, processors, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof.

Herein, novel and unique techniques for an improved inspection of cables and cable joints are disclosed. The present disclosure is not to be limited in scope by the specific examples described herein. Indeed, other various examples of and modifications to the present disclosure, in addition to those described herein, will be apparent to those of ordinary skill in the art from the foregoing description and accompanying drawings.

Thus, such other examples and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A portable cable and joint inspection system, comprising:
 a support structure comprising a set of support arms;
 an x-ray cabinet coupled to the support structure, the x-ray cabinet containing an x-ray camera and positioning equipment, wherein the x-ray camera is mounted on a gimbal, the positioning equipment is coupled to the gimbal and operable to position the x-ray camera to obtain an x-ray image of a cable or a cable joint fed through a set of openings in opposite sidewalls of the x-ray cabinet, wherein the cable or the cable joint is further fed through an opening of each support arm of the set of support arms, and wherein the opening of each support arm of the set of support arms is aligned with the set of openings in opposite sidewalls of the x-ray cabinet, and wherein the x-ray cabinet is rotatable relative to the set of support arms;
 a processor communicatively coupled to the x-ray camera and the positioning equipment; and
 a memory coupled to the processor, the memory operable to store programming code to control the x-ray camera and the positioning equipment, wherein the processor when executing the programming code is operable to:
 actuate the positioning equipment to position the x-ray camera to obtain an x-ray image of a number of selected portions of the cable or cable joint;
 obtain an x-ray image at each selected portion of the number of selected portions of the cable or cable joint, the x-ray image of each selected portion including a number of pixels having predetermined dimensions and each pixel of the number of pixels having a pixel intensity value and coordinates within the x-ray image;
 processing pixel intensity values of the number of pixels of the x-ray image to identify a bounded area within the x-ray image;
 measure a size of the bounded area in the x-ray image based on a number of pixels forming the identified bounded area;
 in response to the size of the identified bounded area being greater than an inclusion or void allowance threshold, flag a pixel location within the x-ray image for detailed inspection, wherein the flagged pixel location corresponds to a physical location within the selected portions of the cable or the cable joint, wherein the inclusion or void allowance threshold varies along a length of the cable or cable joint, between a first zone and a second zone; and
 present on a display device coupled to the processor, the flagged pixel location.

2. The portable cable and joint inspection system of claim 1, wherein the processor, when processing the pixel intensity values of the number of pixels of the x-ray image to identify the bounded area within the x-ray image, is operable to:
 determine a gradient of pixel intensity values exceeding a gradient threshold is present between sets of pixels in the x-ray image; and
 mark locations of pixels of the number of pixels in the x-ray image where the determined gradient of the pixel intensity values exceeds the gradient threshold as an edge of the bounded area within the x-ray image.

3. The portable cable and joint inspection system of claim 2, wherein the processor, when determining the gradient of pixel intensity values exceeding the gradient threshold is present between the sets of pixels in the x-ray image, is operable to:
 compare an intensity value of a first pixel in a first set of pixels of the sets of pixels to an intensity value of a second pixel in the first set of pixels; and
 based on a result of the comparing indicating a difference in respective intensity values, determine a presence of a gradient between a location of the first pixel and a location of the second pixel.

4. The portable cable and joint inspection system of claim 1, wherein the processor, when measuring the size of the identified bounded area, is operable to:

use multi-axial measurements to determine a size of an area bounded by the flagged pixel location;

compare the determined size of the bounded area to an inclusion or void allowance threshold; and in response to a result of the comparing indicating that the inclusion or void allowance threshold has been exceeded, flagging the bounded area as an inclusion or void.

5. The portable cable and joint inspection system of claim 1, wherein the processor is further operable to:

present on the display device, an indication of a location of an inclusion or void and a size of the inclusion or void; and in response to more than one inclusion or void detected provide another indication when a distance between any two of the more than one inclusion or void are closer to one another than a predetermined allowance.

6. The portable cable and joint inspection system of claim 1, wherein the processor, when measuring the size of the identified bounded area in the x-ray image, is further operable to:

use coordinates of a first pixel that corresponds to a first marked location of the marked locations within the x-ray image where a gradient exceeds a gradient threshold as a first measurement position;

use coordinates of a second pixel that corresponds to a second marked location of the marked locations within the x-ray image where the gradient exceeds the gradient threshold as a second measurement position; and measure a distance between the first measurement position to the second measurement position, wherein the measured distance between the first measurement position to the second measurement position is a first axial measurement.

7. The portable cable and joint inspection system of claim 6, wherein the processor, when measuring the size of the identified bounded area in the x-ray image based on the number of pixels forming the identified inclusion or void, is further operable to:

select coordinates of a third pixel that corresponds to a third marked location of the marked locations within the x-ray image, where the gradient exceeds the gradient threshold as a third measurement position;

select coordinates of a fourth pixel that corresponds to a fourth marked location of the marked locations within the x-ray image, where the gradient exceeds the gradient threshold as a fourth measurement position; and measure a distance between the third measurement position to the fourth measurement position, wherein the measured distance between the third measurement position to the fourth measurement position is a second axial measurement.

8. The portable cable and joint inspection system of claim 7, wherein the processor, when measuring the size of the of the identified bounded area or void in the x-ray image based on the number of pixels forming the of the identified bounded area or void, is further operable to:

select coordinates of a fifth pixel that corresponds to a fifth marked location of the marked locations within the x-ray image, where the gradient exceeds the gradient threshold as a fifth measurement position;

select coordinates of a sixth pixel that corresponds to a sixth marked location of the marked locations within the x-ray image, where the gradient exceeds the gradient threshold as a sixth measurement position; and measure a distance between the fifth measurement position to the sixth measurement position, wherein the measured distance between the fifth measurement position to the sixth measurement position is a third axial measurement along a third axis and is non-coplanar with an axis of the first axial measurement and an axis of the second axial measurement.

9. The portable cable and joint inspection system of claim 1, wherein the processor is operable to identify the bounded area by:

determining a change in a gradient of the pixel intensity values of the number of pixels of the x-ray image, where the change is determined when the gradient of the pixel intensity value exceeds a gradient threshold value; and identifying a pixel corresponding to the change in the gradient of pixel values as an edge of the bounded area.

10. The portable cable and joint inspection system of claim 1, wherein the processor is operable to:

determine the x-ray image includes two or more identified bounded areas;

measure a distance between each respective pair of the two or more identified bounded areas;

evaluate the measured distance between each pair with respect to a minimum allowance; and in response to the measured distance being less than the minimum allowance, flag the x-ray image for the detailed inspection.

* * * * *